United States Patent
Chen et al.

(10) Patent No.: US 9,029,983 B2
(45) Date of Patent: May 12, 2015

(54) METAL-INSULATOR-METAL (MIM) CAPACITOR

(71) Applicant: QUALCOMM Incorporated, San Diego, CA (US)

(72) Inventors: Xiangdong Chen, Irvine, CA (US); Haining Yang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/045,604

(22) Filed: Oct. 3, 2013

(65) Prior Publication Data

US 2014/0264751 A1 Sep. 18, 2014

Related U.S. Application Data

(60) Provisional application No. 61/778,270, filed on Mar. 12, 2013.

(51) Int. Cl.
| | |
|---|---|
| *H01L 23/522* | (2006.01) |
| *H01L 27/01* | (2006.01) |
| *H01L 27/06* | (2006.01) |
| *H01L 49/02* | (2006.01) |

(52) U.S. Cl.
CPC ........ *H01L 23/5222* (2013.01); *H01L 23/5228* (2013.01); *H01L 27/016* (2013.01); *H01L 27/0682* (2013.01); *H01L 28/20* (2013.01); *H01L 28/60* (2013.01); *H01L 27/0629* (2013.01)

(58) Field of Classification Search
USPC .......................... 257/533, 692, 724, E21.499
See application file for complete search history.

(56) References Cited

U.S. PATENT DOCUMENTS

| | | | |
|---|---|---|---|
| 7,563,667 | B2 | 7/2009 | Ko et al. |
| 8,237,209 | B2 | 8/2012 | Chang et al. |
| 8,368,136 | B2 | 2/2013 | Chuang et al. |
| 2005/0260822 | A1 | 11/2005 | Keum et al. |
| 2010/0181974 | A1 | 7/2010 | Chen |
| 2010/0295149 | A1 | 11/2010 | Summerfelt et al. |
| 2011/0204509 | A1* | 8/2011 | Lin et al. ........................ 257/692 |
| 2011/0210384 | A1 | 9/2011 | Xia et al. |
| 2012/0292741 | A1* | 11/2012 | Dalton et al. ................. 257/536 |
| 2013/0034946 | A1 | 2/2013 | Chuang et al. |

OTHER PUBLICATIONS

International Search Report and Written Opinion—PCT/US2014/023787—ISA/EPO—Aug. 12, 2004.

* cited by examiner

*Primary Examiner* — Marc Armand
(74) *Attorney, Agent, or Firm* — Novak Druce Connolly Bove + Quigg LLP (57) ABSTRACT

In one embodiment, a chip comprises a capacitor and a resistor. The capacitor comprises a first capacitor terminal, a second capacitor terminal, and a dielectric layer between the first and second capacitor terminals. The second capacitor terminal and the resistor are both fabricated from a resistor metal layer.

15 Claims, 12 Drawing Sheets

METAL-INSULATOR-METAL (MIM) CAPACITOR

CROSS-REFERENCE TO RELATED APPLICATION

This application claims priority to U.S. Provisional Patent Application No. 61/778,270, entitled "METAL-INSULATOR-METAL (MIM) CAPACITOR," filed Mar. 12, 2013, which is expressly incorporated by reference herein in its entirety for all purposes.

FIELD

Aspects of the present disclosure relate generally to capacitors, and more particularly, to MIM capacitors.

BACKGROUND

MIM capacitors are commonly integrated into semiconductor chips, and are widely used in analog applications (e.g., filters, amplifiers, alternating current (AC) couplers, resistor-capacitor (RC) clamps, etc.). MIM capacitors are also commonly used as decoupling capacitors (decaps) to filter out power network noise. A MIM capacitor includes two terminals (e.g., metal plates), and a dielectric layer between the terminals. Ideally, the capacitance of the MIM capacitor has little to no dependence on the voltage applied to the MIM capacitor.

In a conventional chip, MIM capacitors are inserted in the back end of line (BEOL) of the chip. The BEOL of the chip comprises multiple metal layers embedded in multiple insulating layers for interconnecting devices in the chip and connecting devices in the chip to contacts for chip-to-package connections. Fabricating MIM capacitors in the BEOL of a chip requires additional masks and process steps, which increase fabrication costs. This may also create schedule delays, and require a technology file difference from the baseline process.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

According to an aspect, a chip is described herein. The chip comprises a capacitor and a resistor. The capacitor comprises a first capacitor terminal, a second capacitor terminal, and a dielectric layer between the first and second capacitor terminals. The second capacitor terminal and the resistor are both fabricated from a resistor metal layer.

A second aspect relates to a method for fabricating a chip. The method comprises depositing a gate metal layer on a wafer, forming a first capacitor terminal from the deposited gate metal layer, and forming a dielectric layer on the first capacitor terminal. The method also comprises depositing a resistor metal layer on the wafer, and forming a second capacitor terminal and a resistor from the deposited resistor metal layer, the second capacitor terminal overlapping the first capacitor terminal to form a capacitor.

A third aspect relates to an apparatus. The apparatus comprises a charge storing means, wherein the charge storing means comprises a first conducting means, a second conducting means, and an insulating means between the first and second conducting means. The apparatus also comprises a current resisting means, wherein the second conducting means and the current resisting means are both fabricated from a resistor metal layer.

A fourth aspect relates to a method for operating a circuit. The method comprises charging a capacitor, wherein the capacitor comprises a first capacitor terminal, a second capacitor terminal, and a dielectric layer between the first and second capacitor terminals. The method also comprises passing current through a resistor, wherein the second capacitor terminal and the resistor are both fabricated from a resistor metal layer.

To the accomplishment of the foregoing and related ends, the one or more embodiments comprise the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the described embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are in block diagram form in order to avoid obscuring such concepts.

Figure 1:
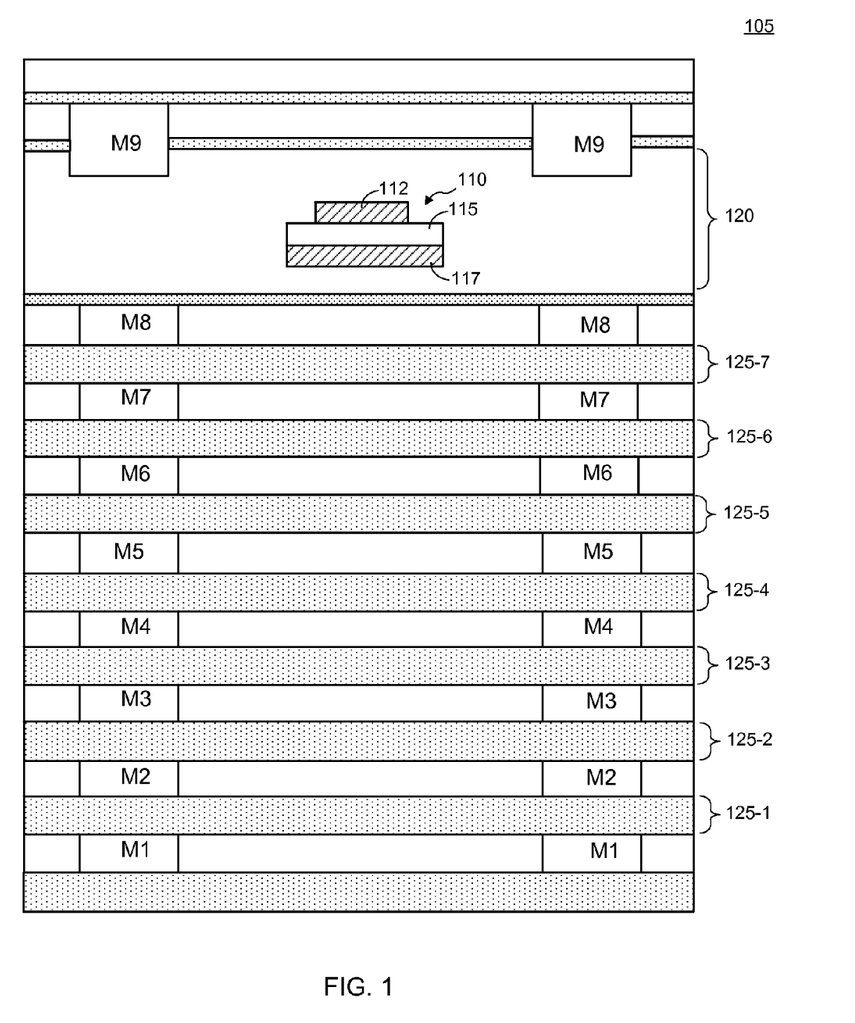
FIG. 1 shows an example of a conventional MIM capacitor inserted in the back end of line (BEOL) of a chip.

FIG. 1 shows a conventional MIM capacitor 110 inserted in the back end of line (BEOL) of a chip 105. In this example, the BEOL of the chip 105 comprises at least nine metal layers labeled M1 to M9 and multiple insulating layers (e.g., dielectric layers). Metal layer M1 is the bottom-most metal layer and metal layer M9 is the upper-most metal layer in FIG. 1. For ease of illustration, the structures (e.g., vias) interconnecting the metal layers are not in FIG. 1.

The metal layers M1 to M9 may be used to interconnect devices (e.g., transistors) in the chip 105 and connect devices in the chip 105 to contacts for chip-to-package connections. The devices (not shown) may be below metal layer M1, in which the devices are fabricated first, and the metal layers M1 and M9 are subsequently fabricated above the devices.

In this example, the MIM capacitor 110 is inserted in the insulating layer 120 between metal layers M8 and M9. The MIM capacitor 110 comprises a top terminal 112, a bottom terminal 117, and a dielectric layer 115 between the terminals 112 and 117. The insulating layer 120 is relatively thick compared with the insulating layers 125-1 to 125-7 between the lower-level metal layers, providing more headroom to form the MIM capacitor 110. Fabricating the MIM capacitor 110 between the metal layers M8 and M9 requires additional masks and process steps, which increase fabrication costs. This may also create schedule delays, and require a technology file difference from the baseline process. Accordingly, it desirable to reduce the number of additional masks and process steps required to fabricate a MIM capacitor.

Figure 2:
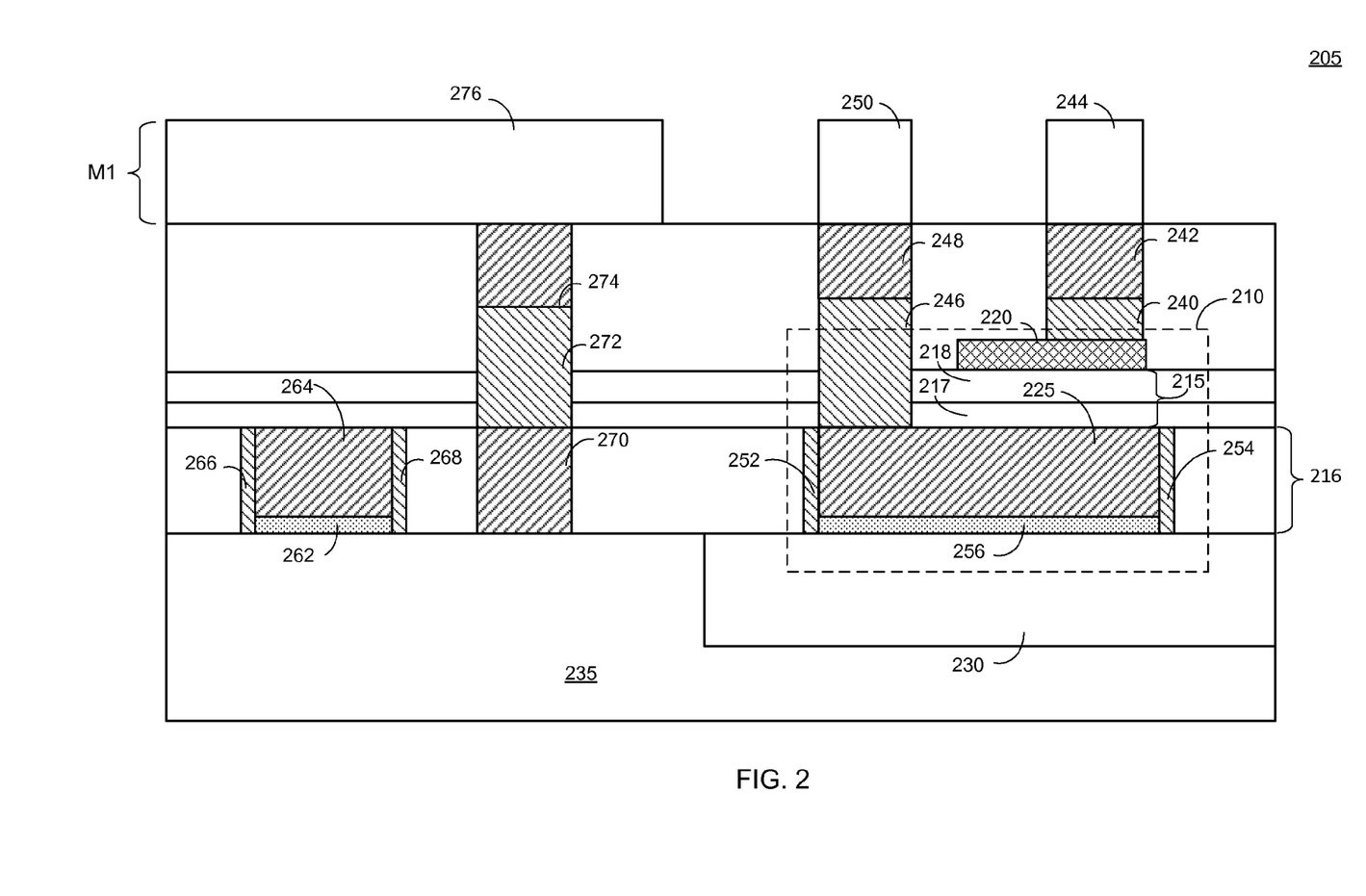
FIG. 2 shows a cross-sectional view of a MIM capacitor according to an embodiment of the present disclosure.

FIG. 2 shows a cross-sectional view of a MIM capacitor 210 integrated in a chip 205 according to an embodiment of the present disclosure. The MIM capacitor 210 may be below metal layer M1 of the chip 205. The MIM capacitor 210 comprises a top terminal 220, a bottom terminal 225, and a dielectric layer 215 between the terminals 220 and 225. In the example in FIG. 2, the dielectric layer 215 comprises a first dielectric layer 217 and a second dielectric layer 218.

The top terminal 220 and the bottom terminal 225 may be fabricated using processes used to fabricate gates and/or resistors in the chip 205. This makes it possible to fabricate the MIM capacitor 210 with no additional masks. In contrast, the MIM capacitor 110 in FIG. 1 requires at least two additional masks to form the top and bottom terminals.

In one embodiment, the bottom terminal 225 is fabricated using processes used to fabricate gates in the chip 205. Therefore, it may be helpful to first describe processes for fabricating gates in the chip 205 before discussing the bottom terminal 225 in greater detail. In this regard, FIG. 2 shows an example of a gate 264 of a transistor in the chip 205. Although the gate 264 is shown next to the MIM capacitor 210 in FIG. 2 for ease of illustration, it is to be appreciated that the gate 264 may be located farther away from the MIM capacitor 210. In general, it is to be appreciated that FIG. 2 is not drawn to scale.

In this example, the gate 264 may include Titanium Nitride (TiN), Tantalum Nitride (TaN), another type of metal, or a combination thereof. The chip 205 also comprises a gate oxide 262 below the gate 264 (between the gate 264 and channel of the transistor). The gate oxide 262 may include a hafnium-based oxide, silicon oxide, silicon nitride, or a combination thereof. The chip 205 may also include spacers 266 and 268 on the sidewalls of the gate 264. The spacers 266 and 268 may include silicon oxide, silicon nitride, silicon oxynitride, or a combination thereof. The spacers 266 and 268 help define the source and drain (not shown) of the transistor (e.g., by acting as an ion-implantation mask during an ion implantation step used to form the source and drain).

The chip 205 may also include multiple contact plugs 270, 272 and 274 to connect the source or drain (not shown) of the transistor to a source or drain contact 276 at metal layer M1. Each of the contact plugs 270, 272 and 274 may include TiN, TaN, copper (Cu), another type of material, or a combination thereof. For a 20 nm fabrication process, each of the contact plugs 270, 272 and 274 may have a thickness of between 20 nm and 60 nm. It is to be appreciated that any two of the contact plugs 270, 272 and 274 may include the same material or different materials, and may have the same thickness or different thicknesses.

The gate 264 may be fabricated using a gate-replacement process. In this example, a dummy gate is formed on the gate oxide 262 by depositing a polysilicon layer on the wafer, and patterning (e.g., using lithography) and etching the deposited polysilicon layer to form the dummy gate. In this disclosure, the wafer refers to the wafer on which the chip 205 is built up during manufacturing. The dummy gate may have the desired dimensions for the gate 264, which is to be formed at a later step.

The spacers 266 and 268 may then be formed on the sidewalls of the dummy gate using known techniques. The drain and source (not shown) of the transistor may then be formed on either side of the gate 264. For example, the drain and source may be formed by implanting dopants into the substrate 235 to form the drain and source using ion implantation. In another example, the drain and source may be deposited using epitaxial deposition. Thermal annealing may then performed to activate the source and drain. A dielectric layer 216 may then be deposited over the wafer. The dielectric layer 216 may then be planarized (e.g., using chemical-mechanical polishing (CMP)) to expose the dummy gate.

The dummy gate may then be removed using wet etching, dry etching (e.g., plasma etching), or another technique. Removal of the dummy gate creates a trench having approximately the desired dimensions for the gate 264. A gate metal layer is then deposited on the wafer (e.g., using electroplating, chemical vapor deposition (CVP), etc.). The gate metal layer may include Titanium Nitride (TiN), Tantalum Nitride (TaN), another type of metal, or a combination thereof. The deposited gate metal layer fills the trench, forming the gate 264. Excess gate metal above the trench is then removed using CMP or another planarization technique.

Thus, in the gate-replacement process, a dummy gate is used as a placeholder for the final gate during fabrication of the transistor. This may be done, for example, to avoid exposing the gate metal to high-temperature annealing used to activate the drain and source of the transistor. In this example, the gate metal layer may be deposited after the high-temperature annealing. It is to be appreciated that the gate-replacement process may include additional steps, and that one or more of the steps described above may be omitted.

The bottom terminal 225 of the MIM capacitor 210 may be fabricated using the above-described processes for fabricating the gate 264. For example, the process used to form the dummy gate may also be used to form a dummy bottom terminal where the final bottom terminal 225 is to be located. The dummy bottom terminal may comprise polysilicon, and may have the desired dimensions for the final bottom terminal 225. The dummy gate and the dummy bottom terminal may be formed by depositing a polysilicon layer on the wafer, and pattering (e.g., using lithography) and etching the polysilicon layer to form the dummy gate and the dummy bottom terminal. The dummy gate and the dummy bottom terminal may be patterned using the same mask or set of masks if multiple patterning (e.g., double patterning) is used.

A dielectric layer 216 may be deposited over the wafer, and then planarized (e.g., using CMP) to expose the dummy gate and the dummy bottom terminal. The dummy gate and the dummy bottom terminal may then be removed using wet etching, dry etching (e.g., plasma etching), or another technique. The removal of the dummy gate and the dummy bottom terminal creates trenches corresponding to the gate and the bottom terminal. A gate metal layer is then deposited on the wafer. The gate metal layer may include Titanium Nitride (TiN), Tantalum Nitride (TaN), another type of metal, or a combination thereof. The deposited gate metal layer fills the trenches to form the gate 264 and the bottom terminal 225. Excess gate metal above the trenches is then removed using CMP or another planarization technique. For a 20 nm fabrication process, the bottom terminal 225 may have a thickness of between 20 nm and 100 nm.

Thus, the bottom terminal 225 and the gate 264 may share process steps, thereby reducing the fabrication cost of the MIM capacitor 210. For example, as discussed above, the same mask may be used for the gate 264 and the bottom terminal 225, eliminating the need for a separate mask to form the bottom terminal 225. Because the bottom terminal 225 and the gate 262 are formed from the same gate metal layer, they may be approximately coplanar in the chip 205.

In the example in FIG. 2, the chip 205 includes spacers 252 and 254 on the sidewalls of the bottom terminal 225, and an oxide 256 below the bottom terminal 225. This allows the bottom terminal 225 to be fabricated as if it were a gate, and therefore allows the bottom terminal 225 to be fabricated with little or no changes to the processes used to fabricate the gate 264. For example, fabrication of the bottom terminal 255 may only require modification of the mask used to fabricate the gate to include a pattern for the bottom terminal 225. In another example, the mask used to fabricate the gate 264 may already include a pattern for an unused gate. In this example, the unused gate may be used for the bottom terminal 225.

In one embodiment, the bottom terminal 225 is above a shallow-trench isolation (STI) region 230 of the chip 205. The STI region 230 may include silicon oxide, silicon nitride, silicon oxynitride, another material, or a combination thereof. STI regions are typically formed in a substrate to provide electrical isolation between active regions in the chip, where each active region may comprise one or more transistors.

After formation of the bottom terminal 225, the first dielectric layer 217 and the second dielectric layer 218 may be deposited on the bottom terminal 225 to form the dielectric layer 215 of the MIM capacitor 210. The first dielectric layer 217 may comprise silicon nitride and have a thickness of between 2 nm to 5 nm. The second dielectric layer 218 may comprise silicon oxide and have a thickness of between 2 nm to 13 nm. The dielectric layer 215 may have a total thickness of between 5 nm and 15 nm.

The top terminal 220 may then be formed on the dielectric layer 215. The top terminal 220 may comprise TiN, TaN, another type of metal, or a combination thereof. For a 20 nm fabrication process, the top terminal 220 may have a thickness of between 5 nm to 20 nm.

In one embodiment, the fabrication process used for the chip 205 may include a resistor metal layer for fabricating resistors in the chip 205. The resistor metal layer may include TiN, TaN, another type of metal, or a combination thereof. The resistor metal layer may be inserted in a middle of line (MOL) of the chip 205. The MOL may be a portion of the chip 205 between transistors and metal layer M1 of the BEOL of the chip 205. The MOL of the chip 205 may include contact plugs for connecting the transistors to metal layer M1 and insulating layers between the transistors and metal layer M1. The resistor metal layer may enable the fabrication of resistors having more precise resistances than can be achieved with poly resistors.

The resistor metal layer may be used to fabricate resistors for various applications. For example, the resistors may be used in amplifiers, voltage regulators, filters, RC clamps, attenuators, bandgap references, etc. The resistors may be formed from the resistor metal layer by patterning (e.g., using lithography) and etching the resistor metal layer. The resistors may also be formed using an additive process, in which trenches corresponding to the resistors are formed in a dielectric layer, the resistor metal layer is deposited on the wafer to fill the trenches, and the portions of the resistor metal layer above the trenches are removed using CMP or another planarization technique.

In this embodiment, the top terminal 220 of the MIM capacitor 210 is fabricated from the resistor metal layer. The top terminal 220 may be fabricated from the resistor metal layer by patterning (e.g., using lithography) and etching the resistor metal layer, using an additive process, or another technique. Thus, the top terminal 220 may be fabricated using processes used to fabricate resistors in the chip 205.

The chip 205 may also include multiple contact plugs 246 and 248 connecting the bottom terminal 225 with a bottom terminal contact 250 at metal layer M1. Each of the contact plugs 246 and 248 may include TiN, TaN, copper (Cu), another type of material, or a combination thereof. For a 20 nm fabrication process, each of the contact plugs 246 and 248 may have a thickness of between 20 nm and 60 nm. It is to be appreciated that the contact plugs 246 and 248 may include the same material or different materials, and may have the same thickness or different thicknesses. The bottom terminal contact 250 may be used to connect the bottom terminal 225 to one or more other devices (not shown) in the chip 205 or a power supply rail.

The chip 205 may also include multiple contact plugs 240 and 242 connecting the top terminal 220 with a top terminal contact 244 at metal layer M1. Each of the contact plugs 240 and 242 may include TiN, TaN, copper (Cu), another type of material, or a combination thereof. For a 20 nm fabrication process, each of the contact plugs 240 and 242 may have a thickness of between 20 nm and 60 nm. It is to be appreciated that the contact plugs 240 and 242 may include the same material or different materials, and may have the same thickness or different thicknesses. The top terminal contact 244 may be used to connect the top terminal 220 to one or more other devices (not shown) in the chip 205 or a power supply rail. It is to be appreciated that the contact plugs and the top terminal 220 may be embedded in one or more insulating layers.

Fabricating the top terminal 220 of the MIM capacitor 210 from the resistor metal layer facilitates the fabrication of resistor-capacitor (RC) circuits. For example, a resistor may be fabricated from the resistor metal layer with one end of the resistor connected to the top terminal 220 and another end of the resistor connected to metal layer M1 using one or more contact plugs. This forms a RC circuit comprising the resistor and the MIM capacitor, which may be used to form a low-pass filter or high-pass filter. In this example, the resistor and the top terminal may be integrated into one piece of metal formed from the resistor metal layer. In another example, the top terminal may be sized to have a desired resistance, in which case the resistor may be built into the top terminal. The MIM capacitor may be used as a decap in combination with the resistor for performing high frequency damping (e.g., to reduce on-chip power network noise), and/or another application. Examples of RC circuits that may be formed using the MIM capacitor 210 and the resistor are provided below.

Figure 3:
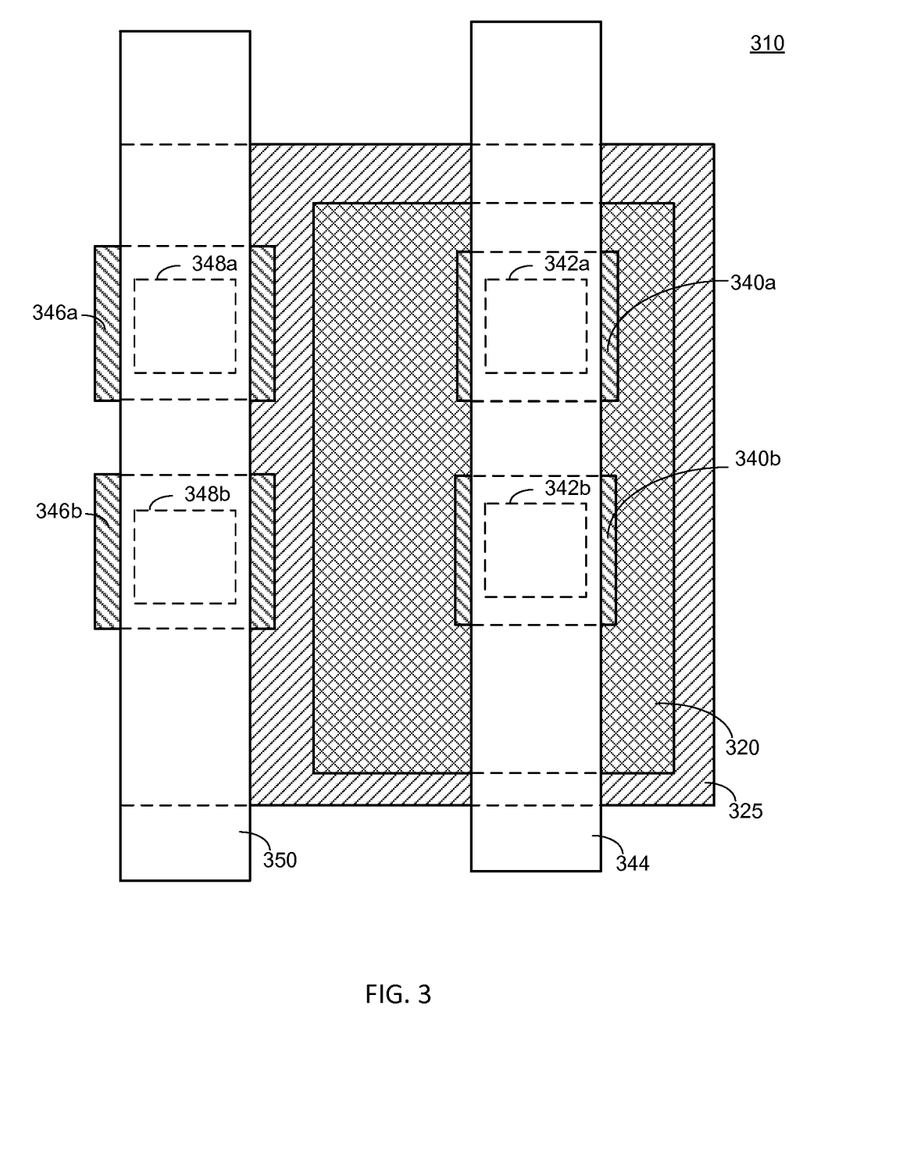
FIG. 3 shows a top-down view of a MIM capacitor according to an embodiment of the present disclosure.

FIG. 3 shows a top-down view of a MIM capacitor 310 according to an embodiment of the present disclosure, in which the top terminal 320 comprises a single plate and the bottom terminal 325 comprises a single plate. In this embodiment, the areas of the plates may be chosen to achieve a desired capacitance for the MIM capacitor 310 with larger areas corresponding to larger capacitances.

The MIM capacitor 310 also comprises a top terminal contact 344 at metal layer M1 positioned above the top terminal 320, and multiple contact plugs 340a, 340b, 342a and 342b connecting the top terminal 320 to the top terminal contact 344. Each of contact plugs 340a and 340b may correspond to contact plug 240 in FIG. 2, and each of contact plugs 342a and 342b may correspond to contact plug 242 in FIG. 2. In FIG. 3, the portions of the contact plugs 340a, 340b, 342a and 342b beneath the top terminal contact 344 are shown using phantom lines. It is to be appreciated that the contact plugs 340a, 340b, 342a and 342b may have the same dimensions or different dimensions.

The MIM capacitor 310 also comprises a bottom terminal contact 350 at metal layer M1 positioned above a portion of the bottom terminal 325 that does not overlap the top terminal 320. The MIM capacitor 310 also comprises multiple contact plugs 346a, 346b, 348a and 348b connecting the bottom terminal 325 to the bottom terminal contact 350. Each of contact plugs 346a and 346b may correspond to contact plug 246 in FIG. 2, and each of contact plugs 348a and 348b may correspond to contact plug 248 in FIG. 2. In FIG. 3, the portions of the contact plugs 346a, 346b, 348a and 348b beneath the bottom terminal contact 350 are shown using phantom lines. It is to be appreciated that the contact plugs 346a, 346b, 348a and 348b may have the same dimensions or different dimensions. For ease of illustration, the dielectric layer between the top and bottom terminals 320 and 325 is not in FIG. 3.

Figure 4:
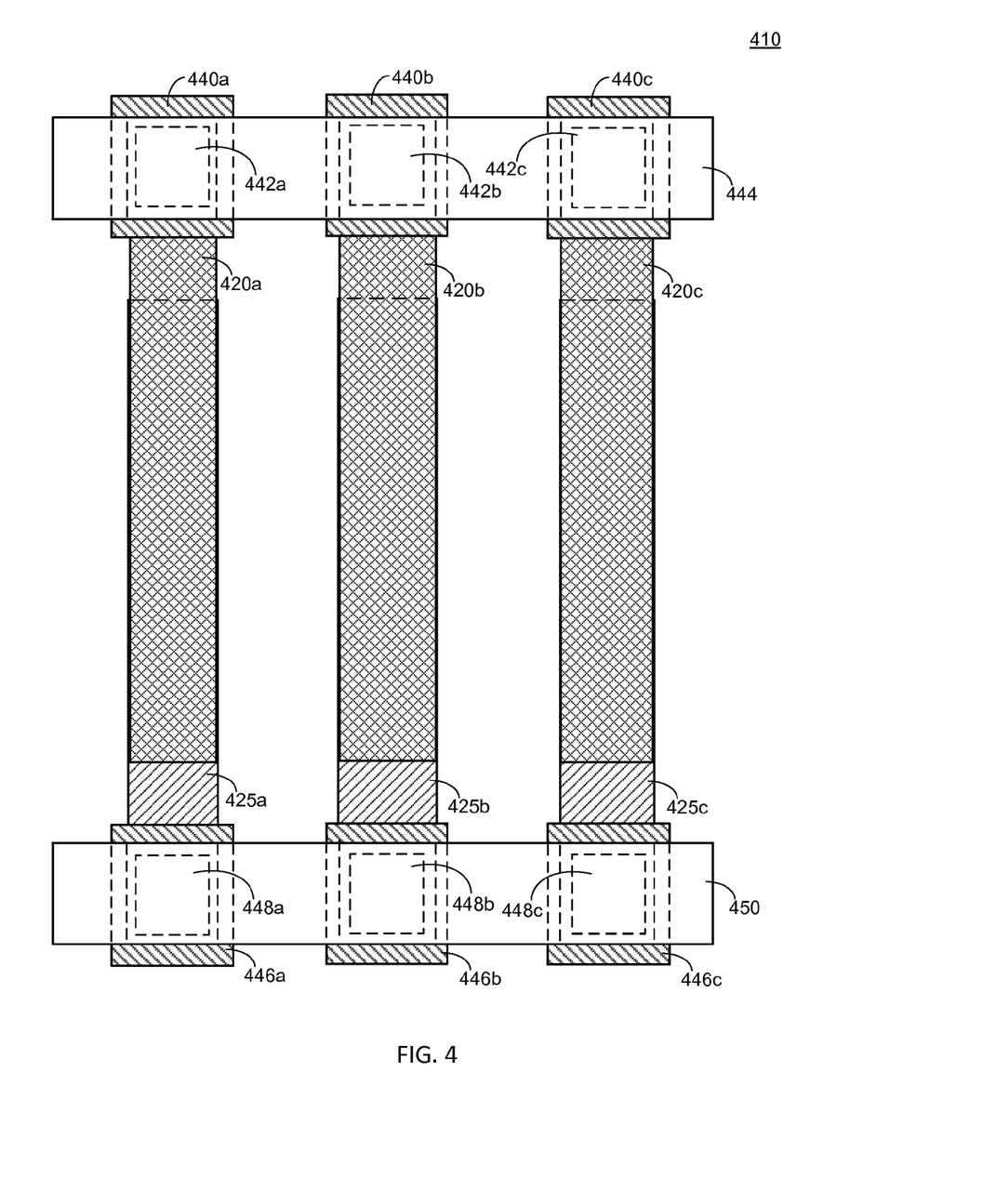
FIG. 4 shows a top-down view of a MIM capacitor according to another embodiment of the present invention.

FIG. 4 shows a top-down view of a MIM capacitor 410 according to another embodiment of the present disclosure. In this embodiment, the top terminal comprises three fingers 420a, 420b and 420c, and the bottom terminal comprises three fingers 425a, 425b and 425b, in which each finger of the top terminal overlaps a respective finger of the bottom terminal.

The MIM capacitor 410 also comprises a top terminal contact 444 positioned above the fingers 420a, 420b and 420c of the top terminal. The MIM capacitor 410 also comprises contact plugs 440a and 442a connecting finger 420a to the top terminal contact 444, contact plugs 440b and 442b connecting finger 420b to the top terminal contact 444, and contact plugs 440c and 442c connecting finger 420c to the top terminal contact 444. Each of contact plugs 440a, 440b and 440c may correspond to contact plug 240 in FIG. 2, and each of contact plugs 442a, 442b and 442c may correspond to contact plug 242 in FIG. 2. In FIG. 4, the portions of the contact plugs 440a, 440b, 440c, 442a, 442b and 442c beneath the top terminal contact 444 are shown using phantom lines.

The MIM capacitor 410 also comprises a bottom terminal contact 450 positioned above the fingers 425a, 425b and 425c of the bottom terminal. The MIM capacitor 410 also comprises contact plugs 446a and 448a connecting finger 425a to the bottom terminal contact 450, contact plugs 446b and 448b connecting finger 425b to the bottom terminal contact 450, and contact plugs 446c and 448c connecting finger 425c to the bottom terminal contact 450. Each of contact plugs 446a, 446b and 446c may correspond to contact plug 246 in FIG. 2, and each of contact plugs 448a, 448b and 448c may correspond to contact plug 248 in FIG. 2. In FIG. 4, the portions of the contact plugs 446a, 446b, 446c, 448a, 448b and 448c beneath the bottom terminal contact 450 are shown using phantom lines.

For ease of illustration, the dielectric layer between the top and bottom terminals is not in FIG. 4. The top and bottom contacts 444 and 450 may be at metal layer M1 for connecting the MIM capacitor 410 to one or more other devices (not shown) in the chip and/or one or more power supply rails.

The combined area of the fingers 420a, 420b and 420c of the top terminal determines the overall area of the top terminal, and the combined area of the fingers 425a, 425b and 425c of the bottom terminal determines the overall area of the bottom terminal. Thus, the capacitance of the MIM capacitor 410 is determined in part by the combined area of the fingers 420a, 420b and 420c of the top terminal, and the combined area of the fingers 425a, 425b and 425c of the bottom terminal. For a given area for each finger, the capacitance of the MIM capacitor 410 may be increased by increasing the number of fingers for each terminal, and the capacitance of the MIM capacitor 410 may be decreased by reducing the number of fingers for each terminal.

The MIM capacitor 410 may be used to achieve a desired capacitance when the dimensions of each gate is restricted (e.g., by a design rule). In this example, the size restriction for each gate may also apply to the bottom terminal of the MIM capacitor 410. As a result, it may not be possible to achieve the desired capacitance using a single plate for the bottom terminal without violating the size restriction. In this case, the desired capacitance may be achieved by using two or more fingers for the bottom terminal. This is because the dimensions of each finger may satisfy the size restriction for each gate, while the combined area of the fingers provides a large enough overall area for the bottom terminal to achieve the desired capacitance. Thus, the fingers allow the MIM capacitor 410 to achieve higher capacitances while satisfying the size restriction for each gate.

In one embodiment, each finger may have similar dimensions (e.g., width and/or length) as a gate. This may allow the fingers to be fabricated using processes used to fabricate the gates with little or no changes to the processes. A gate may have an elongated rectangular shape, in which the gate extends across two or more transistors in a cell. For example, the gate may extend across two complementary transistors (e.g., an N-type metal-oxide-semiconductor (NMOS) transistor and a P-type metal-oxide-semiconductor (PMOS) transistor) to form an inverter. In this example, the gate is shared by the complementary transistors and is used as the input of the inverter. Thus, each finger of the bottom terminal may have a similar elongated rectangular shape, as shown in the example in FIG. 4. It is to be appreciated that the fingers are not limited to the exemplary shapes in FIG. 4, and may have other shapes.

Figure 5:
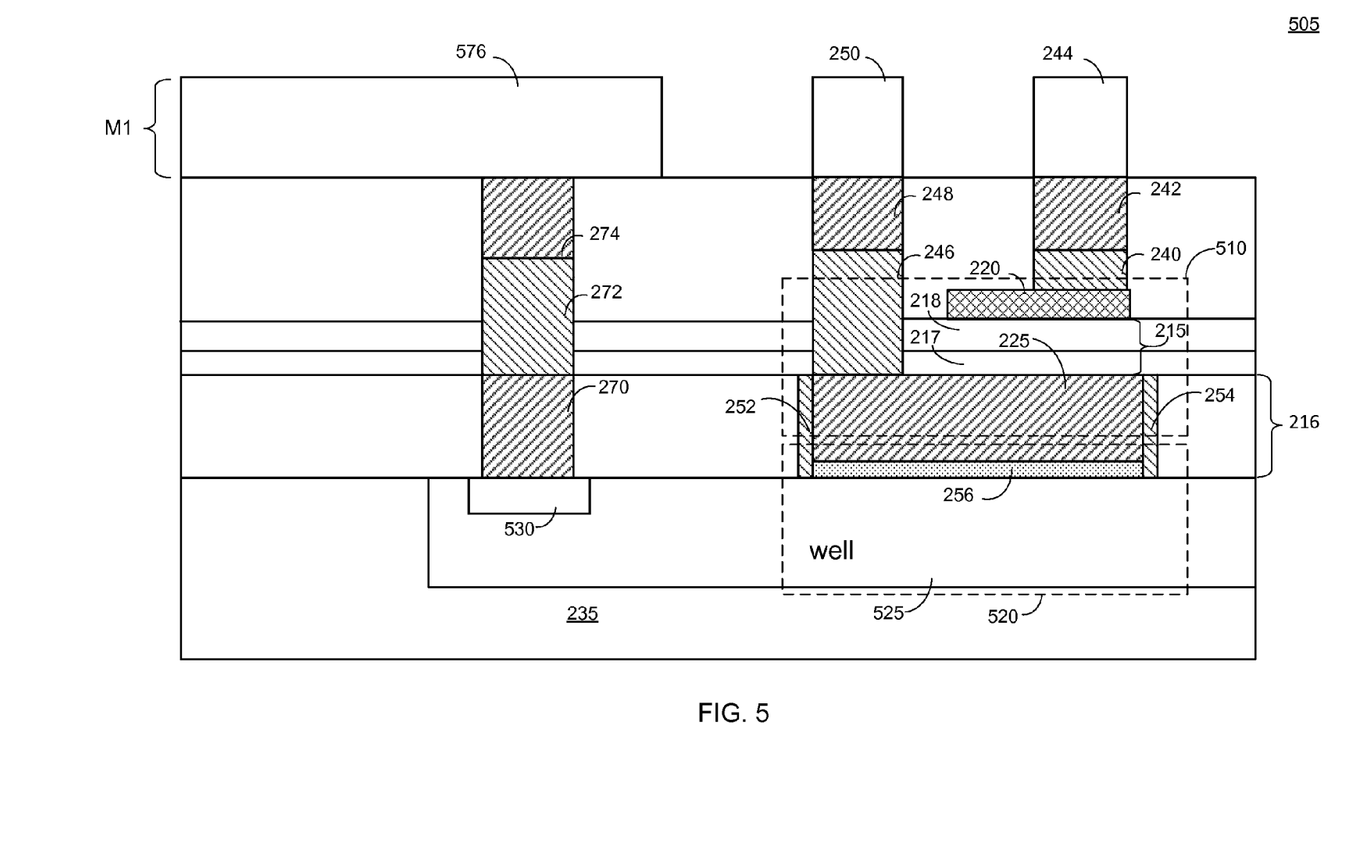
FIG. 5 shows a cross-sectional view of a MIM capacitor and a metal-oxide-semiconductor (MOS) capacitor according to an embodiment of the present disclosure.

FIG. 5 shows a MIM capacitor 510 and a metal-oxide-semiconductor (MOS) capacitor 520 integrated in a chip 505 according to an embodiment of the present disclosure. The MIM capacitor 510 is similar to the MIM capacitor 210 in FIG. 2 except that the MIM capacitor 510 is above a well 525 in the substrate 235 instead of the STI region 230. The well 525 may be an N-type well formed in the substrate 235 by doping the substrate 235 with an N-type dopant. The substrate 235 may be a P-type substrate.

The MOS capacitor 520 is formed by the bottom terminal 225, the oxide 256, and the well 525. The well 525 serves as a first terminal of the MOS capacitor 520, and the bottom terminal 225 serves as a second terminal of the MOS capacitor 520. The oxide 256 between the bottom terminal 225 and the well 525 serves as the dielectric layer of the MOS capacitor 520. The oxide 256 may include a hafnium-based oxide, silicon oxide, silicon nitride, or a combination thereof.

The chip 505 includes a well contact 530 within the well 525, in which well contact 530 may comprise a more heavily-doped region of the well 525. The well contact 530 is connected to a first terminal contact 576 via contact plugs 270, 272 and 274. Thus, the well 525 (which forms the first terminal of the MOS capacitor 520) is connected to the first terminal contact 576 via the well contact 530 and the contact plugs 270, 272 and 274. The bottom terminal 225 (which forms the second terminal of the MOS capacitor 520) is connected to the bottom terminal contact 250 via contact plugs 246 and 248. Thus, the bottom terminal 225 is shared between the MIM capacitor 510 and the MOS capacitor 520. The bottom terminal contact 250 serves as a terminal contact for both the MIM capacitor 510 and the MOS capacitor 520.

Figure 6A:
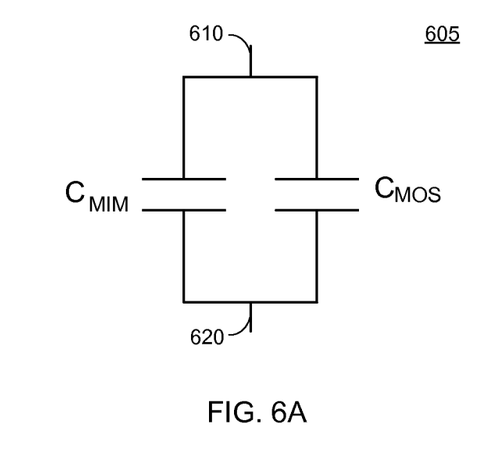
FIG. 6A is a circuit schematic showing the MIM capacitor and the MOS capacitor connected in a first configuration according to an embodiment of the present disclosure.

FIG. 6A shows an example of a circuit schematic of the MIM capacitor 510 (labeled $C_{MIM}$) and the MOS capacitor 520 (labeled $C_{MOS}$), in which the capacitors are connected in parallel. In this example, a first contact 610 of the parallel-connected capacitors 605 may be formed by connecting terminal contacts 244 and 576 in FIG. 5 together. A second contact 620 of the parallel-connected capacitors 605 corresponds to the bottom terminal contact 250 in FIG. 5, which is shared by the MIM capacitor 510 and the MOS capacitor 520.

Figure 6B:
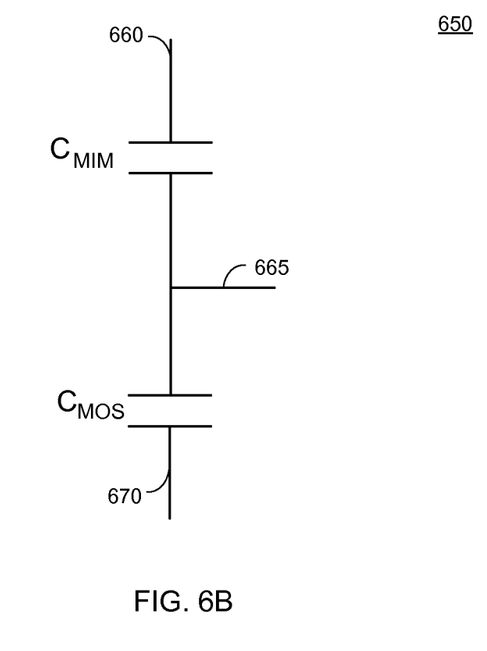
FIG. 6B is a circuit schematic showing the MIM capacitor and the MOS capacitor connected in a second configuration according to an embodiment of the present disclosure.

FIG. 6B shows another example of a circuit schematic of the MIM capacitor 510 (labeled $C_{MIM}$) and the MOS capacitor 520 (labeled $C_{MOS}$). In this example, the MIM capacitor 510 and the MOS capacitor 520 form a capacitor circuit 650 having a first contact 660, a second contact 665, and a third contact 670. The first contact 660 may correspond to the top terminal contact 244 in FIG. 5, the second contact 665 may correspond to the bottom terminal contact 250 in FIG. 5, and the third contact 670 may correspond to the first terminal contact 576 in FIG. 5. In this example, each of the contacts 660, 665 and 670 may be connected to a different node in a circuit. For applications in which the capacitors 510 and 520 are to be connected in series, the second contact 665 may be omitted. In this case, the bottom terminal contact 250 and contact plugs 246 and 248 in FIG. 5 may also be omitted. Thus, the MIM capacitor 510 and the MOS capacitor 520 may be connected in various configurations.

Figure 7:
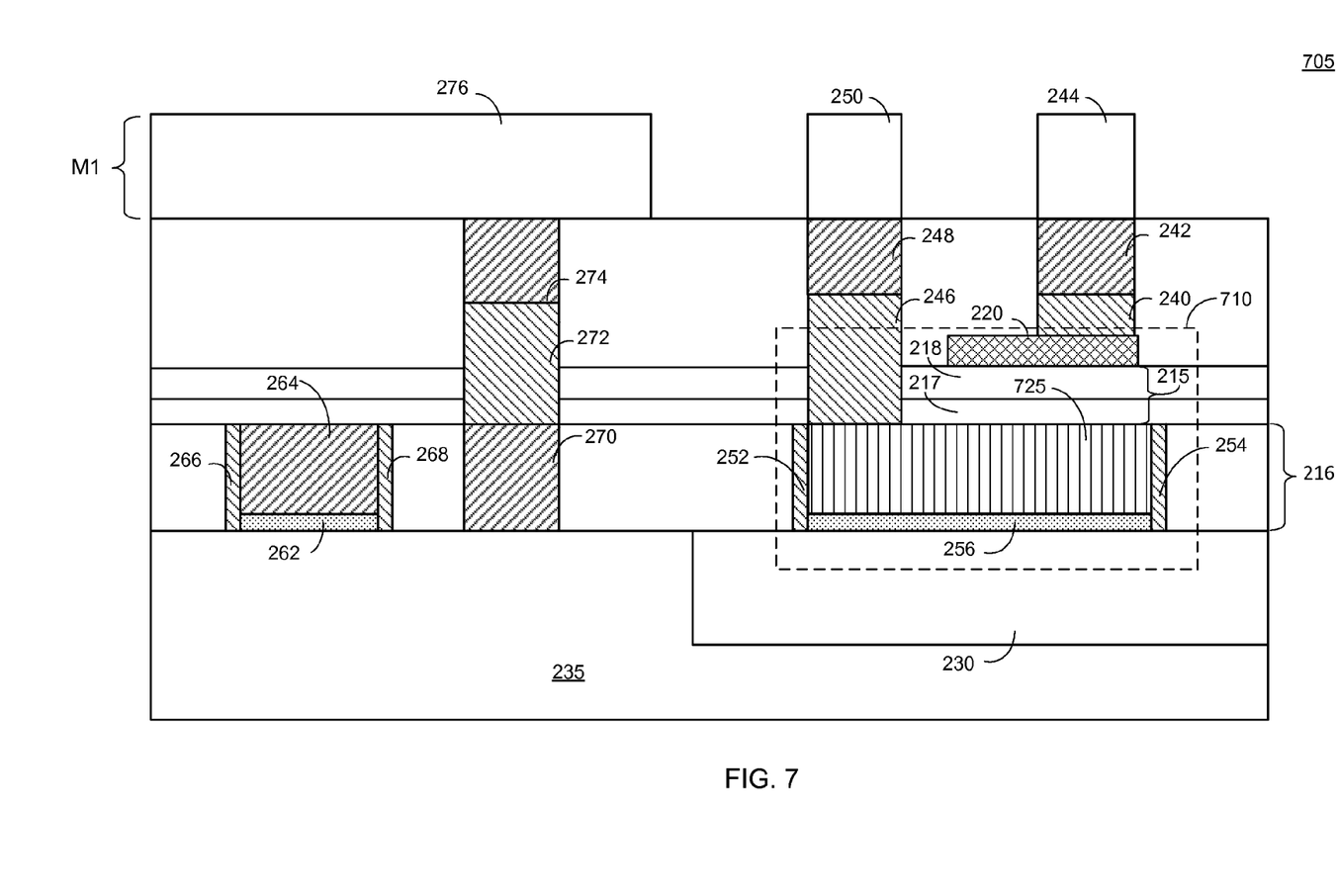
FIG. 7 shows a MIM capacitor including a polysilicon terminal according to an embodiment of the present invention.

FIG. 7 shows a MIM capacitor 710 integrated in a chip 705 according to an embodiment of the present disclosure. The MIM capacitor 710 is similar to the MIM capacitor 210 in FIG. 2 except that the bottom terminal 725 includes polysilicon. This may accomplished by leaving the dummy bottom terminal for the final bottom terminal instead of removing the dummy bottom terminal to create a trench, and filling the trench with gate metal to form the final bottom terminal.

Figure 8:
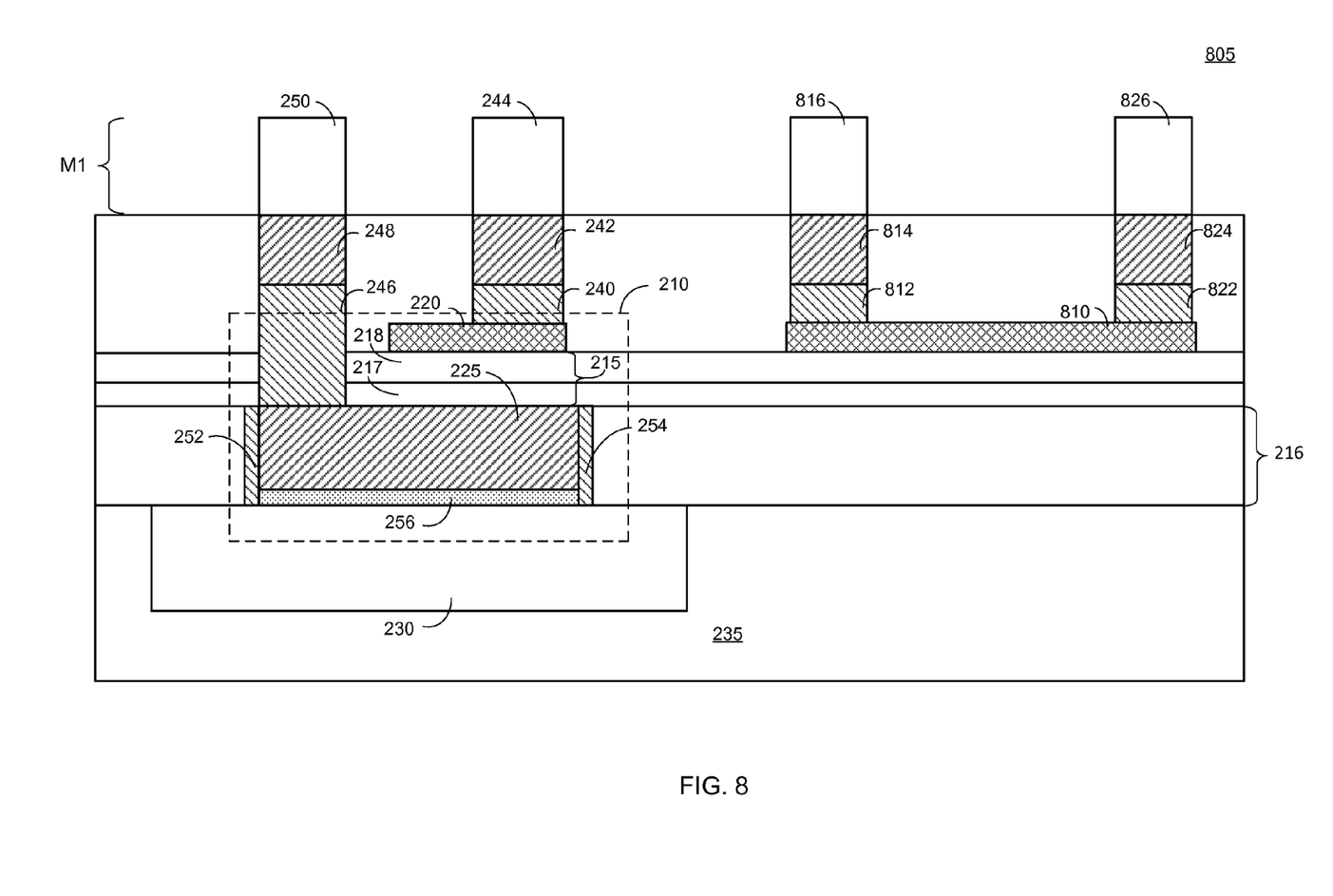
FIG. 8 shows a cross-sectional view of a MIM capacitor and a resistor according to an embodiment of the present disclosure.

As discussed above, the top terminal 220 of the MIM capacitor 210 may be fabricated using the same resistor metal layer used to fabricate resistors on the chip. In this regard, FIG. 8 shows a cross-sectional view of the MIM capacitor 210 and a resistor 810 integrated in a chip 805 according to an embodiment of the present disclosure. For ease of illustration, the gate 264 is not in FIG. 8.

The top terminal 220 of the MIM capacitor 210 and the resistor 810 are fabricated from the same resistor metal layer using any of the fabrication techniques discussed above. Thus, the top terminal 220 and the resistors 810 may be fabricated using the same process steps, thereby reducing fabrication costs. Because the top terminal 220 and the resistor 810 are formed from the same resistor metal layer, they may be approximately coplanar in the chip 805.

The resistor 810 may be dimensioned to achieve a desired resistance. As discussed above, fabricating the resistor 810 from the resistor metal layer allows the resistance of the resistor 810 to be more precise compared with polysilicon. The resistor 810 may be formed over an STI region (not in FIG. 8) in the substrate 235. Although the resistor 810 is shown next to the MIM capacitor 210 in FIG. 8 for ease of illustration, it is to be appreciated that the resistor 810 may be located farther away from the MIM capacitor 210. In general, it is to be appreciated that FIG. 8 is not drawn to scale.

The chip 805 may also include contact plugs 812 and 814 to connect one end of the resistor 810 to a first resistor contact 816 and contact plugs 822 and 824 to connect the other end of the resistor 810 to a second resistor contact 826. The contact plugs 812, 814, 822 and 824 may be embedded in one or more insulating layers between the resistor 810 and metal layer M1. The first and second resistor contacts 816 and 826 may be formed from metal layer M1, and may be used to connect the resistor 810 to a circuit utilizing the resistor 810. For example, the resistor 810 may be used in an amplifier, a voltage regulator, a filter, an RC clamp, an attenuator, a bandgap reference, or other type of circuit integrated in the chip 805. Alternatively or in addition, the resistor 810 may be connected to a device (e.g., a transistor) located at a lower level in the chip 805 than the resistor 810 by a contact plug between the resistor 810 and the device.

Figure 9:
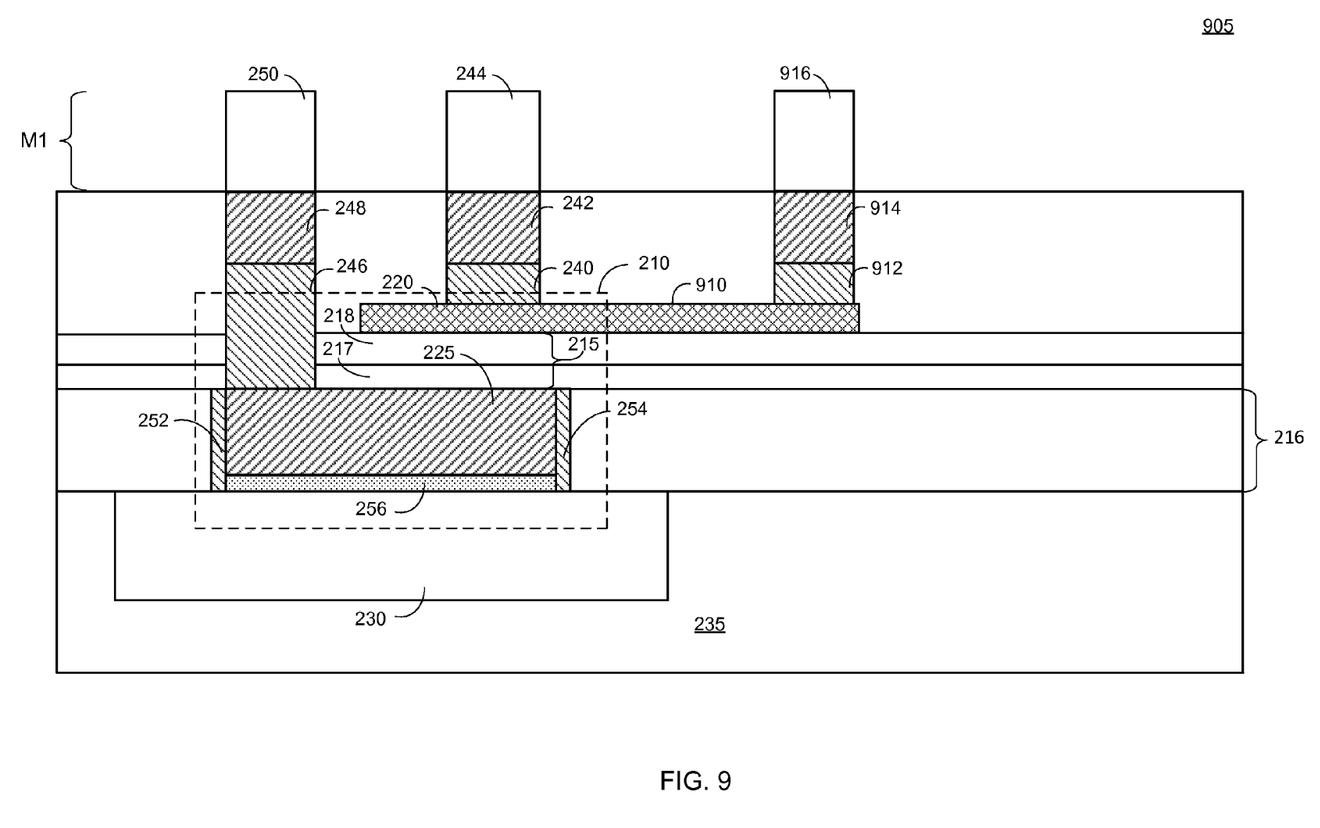
FIG. 9 shows a cross-sectional view of a MIM capacitor integrated with a resistor according to an embodiment of the present disclosure.

As discussed above, the top terminal 220 of the MIM capacitor 210 may be integrated with a resistor to form an RC circuit. In this regard, FIG. 9 shows a cross-sectional view of the MIM capacitor 210, in which the top terminal 220 is integrated with a resistor 910 according to an embodiment of the present disclosure. In this embodiment, one end of the resistor 910 is connected to a resistor contact 916 via contact plugs 912 and 914. The other end of the resistor 910 is connected to the top terminal 220 of the MIM capacitor 210.

The top terminal 220 of the MIM capacitor 210 and the resistor 910 may be fabricated together from the resistor metal layer using any of the fabrication techniques discussed above. In one embodiment, the top terminal 220 and the resistor 910 may comprise one piece of metal fabricated from the resistor metal layer, in which one portion of the metal piece forms the top terminal 220 and another portion of the metal piece forms the resistor 910. Thus, in this embodiment, the top terminal 220 and the resistor 910 are contiguous. The top terminal 220 may be dimensioned to achieve a desired capacitance and the resistor 910 may be dimensioned to achieve a desired resistance.

Figure 10A:
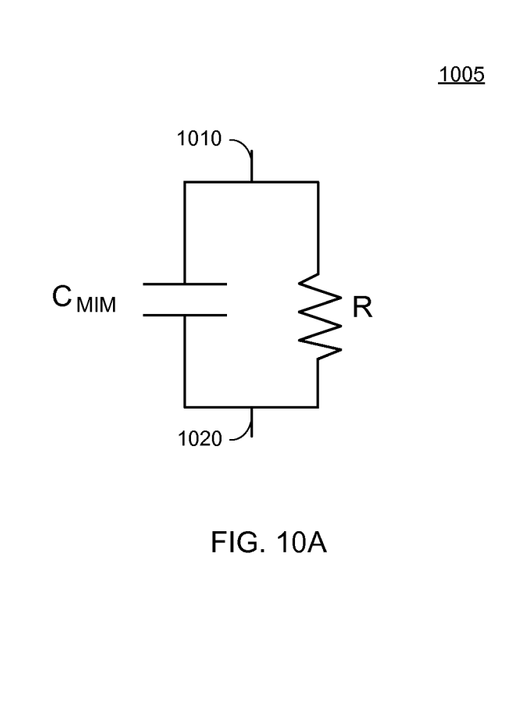
FIG. 10A is a circuit schematic showing of the MIM capacitor and the resistor in FIG. 9 connected in a first configuration according to an embodiment of the present disclosure.

FIG. 10A shows an example of a circuit schematic of the MIM capacitor 210 (labeled $C_{MIM}$) and the resistor 910 (labeled R), in which the MIM capacitor 210 and the resistor 910 are connected in parallel to form a parallel RC circuit 1005. In this example, a first contact 1010 of the parallel RC circuit 1005 corresponds to the top terminal contact 244 in FIG. 9, which is connected to the top terminal 220 of the MIM capacitor 210 and one end of the resistor 910 via contact plugs 240 and 242. A second contact 1020 may be formed by connecting the bottom terminal contact 250 and the resistor contact 916 in FIG. 9 together. The parallel RC circuit 1005 may be used in various applications. For example, the parallel RC circuit 1005 may be used to form a low-pass filter.

Figure 10B:
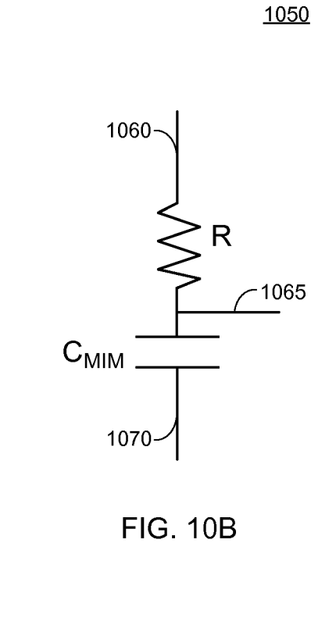
FIG. 10B is a circuit schematic showing of the MIM capacitor and the resistor in FIG. 9 connected in a second configuration according to an embodiment of the present disclosure.

FIG. 10B shows another example of a circuit schematic of the MIM capacitor 210 (labeled $C_{MIM}$) and the resistor 910. In this example, the MIM capacitor 210 and the resistor 910 form an RC circuit 1050 having a first contact 1060, a second contact 1065, and a third contact 1070. The first contact 1060 may correspond to the resistor contact 916 in FIG. 9, the second contact 1065 may correspond to the top terminal contact 244 in FIG. 9, and the third contact 1070 may correspond to the bottom terminal contact 250 in FIG. 9. In this example, each of the contacts 1060, 1065 and 1070 may be connected to a different node in a circuit.

The RC circuit 1050 may be used in various applications. For example, the RC circuit 1050 may be used in an RC-trigger electrostatic discharge (ESD) clamp to detect an ESD event (e.g., transient pulse). In another example, the RC circuit 1050 may be used to form a high-pass filter (e.g., for an AC coupler) or a low-pass filter (e.g., to reduce high-frequency noise). For a high-pass filter, the output of the RC circuit 1050 may be taken across the resistor 910 and for a low-pass filter, the output of the RC circuit 1050 may be taken across the capacitor 210.

For applications in which the MIM capacitor 210 and the resistor 910 are to be connected in series, the second contact 1065 may be omitted. In this case, the top terminal contact 244 and contact plugs 240 and 242 in FIG. 9 may also be omitted. Thus, the MIM capacitor 210 and the resistor 910 may be connected in various configurations.

Figure 11:
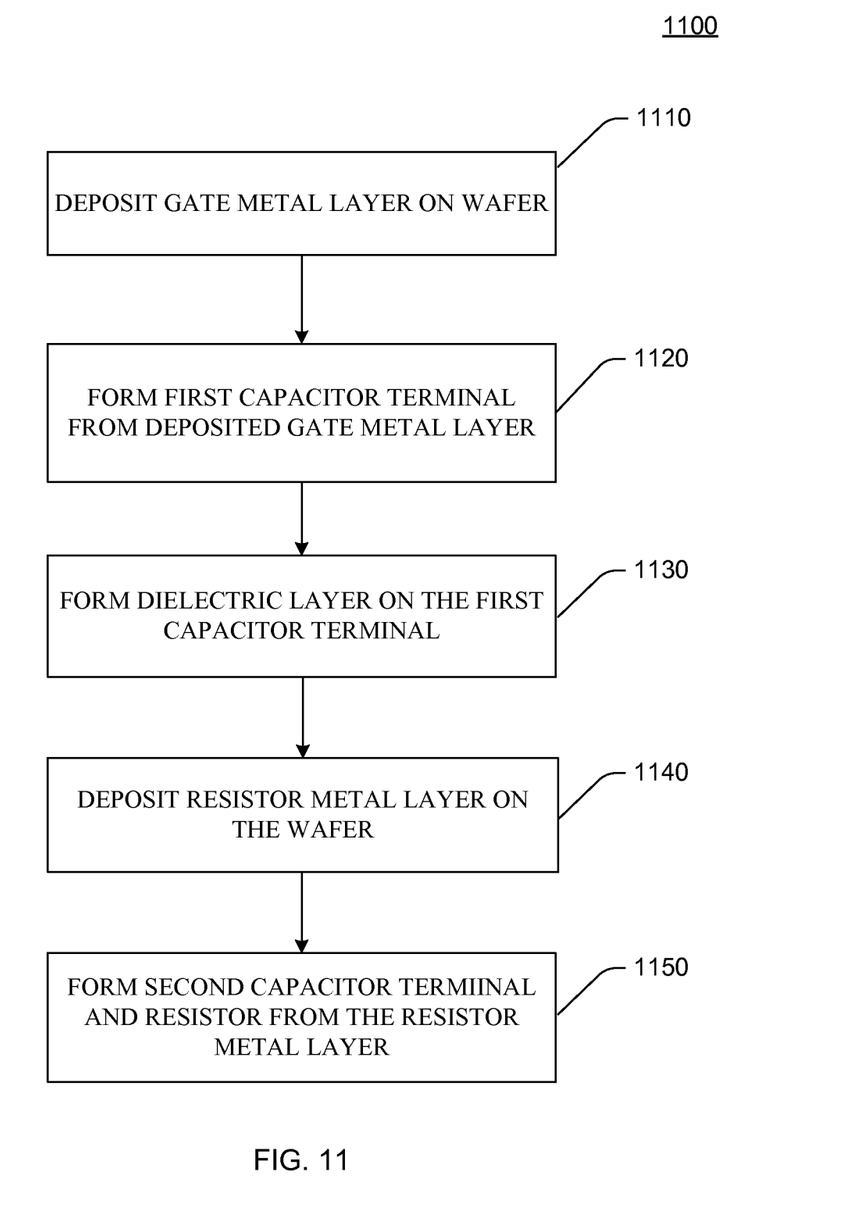
FIG. 11 is a flowchart illustrating a method for fabricating a MIM capacitor according to an embodiment of the present disclosure.

FIG. 11 shows a method 1100 for fabricating a MIM capacitor according to an embodiment of the present disclosure.

In step 1110, a gate metal layer is deposited on a wafer. The gate metal layer may include TiN, TaN, another type of metal, or a combination thereof.

In step 1120, a first capacitor terminal is formed from the deposited gate metal layer. The first capacitor terminal (e.g., the bottom terminal 225) may be formed by patterning (e.g., using lithography) and etching the gate metal layer, or other technique. Transistor gates may also be formed from the deposited gate metal layer.

In step 1130, a dielectric layer is formed on the first capacitor terminal. The dielectric layer (e.g., dielectric layer 215) may comprise multiple dielectric layers.

In step 1140, a resistor metal layer is deposited on the wafer. The resistor metal layer may include TiN, TaN, another type of metal, or a combination thereof.

In step 1150, a second capacitor terminal and a resistor is formed from the deposited resistor metal layer. The second capacitor terminal overlaps the first capacitor terminal to form the MIM capacitor. The second capacitor terminal (e.g., the top terminal 220) and the resistor (e.g., resistor 810 or resistor 910) may be formed by patterning (e.g., using lithography) and etching the gate metal layer. The second capacitor terminal and the resistor may also be fabricating by forming trenches corresponding the second capacitor terminal and the resistor in a dielectric layer, filling the trenches with the resistor metal later to form the second capacitor terminal and the resistor, and removing the excess resistor metal layer using a planarization technique.

Figure 12:
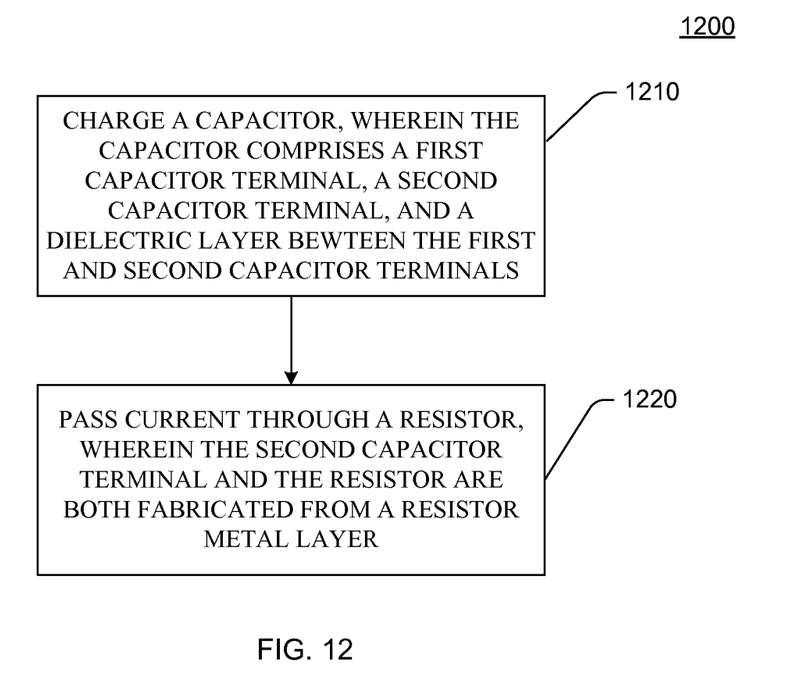
FIG. 12 is a flowchart illustrating a method for operating a circuit according to an embodiment of the present disclosure.

FIG. 12 shows a method 1200 for operating a circuit according to an embodiment of the present disclosure.

In step 1210, a capacitor is charged, wherein the capacitor (e.g., capacitor 210) comprises a first capacitor terminal (e.g., bottom terminal 225), a second capacitor terminal (e.g., top terminal 220), and a dielectric layer (e.g., dielectric layer 215) between the first and second capacitor terminals.

In step 1220, a current is passed through a resistor, wherein the second capacitor terminal (e.g., top terminal 220) and the resistor (e.g., resistor 810) are both fabricated from a resistor metal layer.

It is to be appreciated that embodiments of the present disclosure are not limited to the examples discussed above. For instance, although exemplary thickness ranges are given above for a 20 nm fabrication process, it is to be appreciated that embodiments of the present disclosure can be used in other fabrication processes. Also, the dummy gate and the dummy bottom terminal may include other materials besides polysilicon.

It is to be appreciated that the terms "top" and "bottom" in the top terminal 220 and the bottom terminal 225 refer to the relative positions of the terminals in FIG. 2, and that, from the perspective of a circuit using the MIM capacitor 210, the terminals may be interchangeable. For example, for an application in which one of the terminals of the MIM capacitor 210 is grounded, any one of the top and bottom terminals 220 and 225 may be grounded.

Also, it is to be appreciated that a contact plug may include two or more materials. For example, a contact plug including copper may also include a barrier metal surrounding the copper.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A chip, comprising:
   a capacitor, wherein the capacitor comprises:
      a first capacitor terminal;
      a second capacitor terminal; and
      a dielectric layer between the first and second capacitor terminals;
   a resistor, wherein the second capacitor terminal and the resistor are both fabricated from a resistor metal layer; and
   a transistor gate, wherein the first capacitor terminal and the transistor gate are both fabricated from a gate metal layer.

2. The chip of claim 1, wherein the second capacitor terminal and the resistor are approximately coplanar.

3. The chip of claim 1, wherein the second capacitor terminal is connected to the resistor.

4. The chip of claim 1, wherein the resistor has a first end and a second end opposite the first end, and the chip further comprises a first contact connected to the first end of the resistor and a second contact connected to the second end of the resistor.

5. The chip of claim 1, further comprising a shallow-trench isolation (STI) region below the capacitor.

6. The chip of claim 1, wherein the resistor metal layer comprises at least one of Titanium Nitride (TiN) and Tantalum Nitride (TaN).

7. The chip of claim 3, wherein the second capacitor terminal and the resistor are contiguous.

8. The chip of claim 4, wherein the resistor is part of a voltage regulator, an attenuater, a voltage divider, or a bandgap reference.

9. The chip of claim 7, wherein the resistor has a first end connected to the second capacitor terminal and a second end opposite the first end, and the chip further comprises a first contact connected to the second capacitor terminal, and a second contact connected to the second end of the resistor.

10. A chip, comprising:
   a capacitor, wherein the capacitor comprises:
      a first capacitor terminal;
      a second capacitor terminal; and
      a dielectric layer between the first and second capacitor terminals;
   a resistor, wherein the second capacitor terminal and the resistor are both fabricated from a resistor metal layer;
   an oxide layer below the first capacitor terminal; and
   a substrate well below the oxide layer, wherein the first capacitor terminal, the well and the oxide layer form a second capacitor.

11. The chip of claim 10, further comprising a first contact connected to the first capacitor terminal, a second contact connected to the second capacitor terminal, and a third contact connected to the well.

12. An apparatus, comprising:
   a charge storing means, wherein the charge storing means comprises:
      a first conducting means;
      a second conducting means; and
      an insulating means between the first and second conducting means;
   a current resisting means, wherein the second conducting means and the current resisting means are both fabricated from a resistor metal layer; and
   a transistor gating means, wherein the first conducting means and the transistor gating means are both fabricated from a gate metal layer.

13. The apparatus of claim 12, wherein the second conducting means and the current resisting means are approximately coplanar.

14. The apparatus of claim 12, wherein the second conducting means is connected to the current resisting means.

15. The apparatus of claim 14, wherein the second conducting means and the current resisting means are contiguous.

* * * * *